(12) United States Patent
Verlinden et al.

(10) Patent No.: US 8,928,401 B2
(45) Date of Patent: Jan. 6, 2015

(54) AMPLIFIER WITH FILTERING

(71) Applicant: NXP B.V., Eindhoven (NL)

(72) Inventors: Jos Verlinden, Wachtendonk (DE);
Remco van de Beek, Eindhoven (NL);
Massimo Ciacci, Den Bosch (NL)

(73) Assignee: NXP, B.V., Eindhoven (NL)

( * ) Notice: Subject to any disclaimer, the term of this patent is extended or adjusted under 35 U.S.C. 154(b) by 92 days.

(21) Appl. No.: 13/684,886

(22) Filed: Nov. 26, 2012

(65) Prior Publication Data

US 2014/0145787 A1     May 29, 2014

(51) Int. Cl.
*H03G 1/04*     (2006.01)
*H03F 3/68*     (2006.01)
*H03F 3/217*    (2006.01)
*H03M 1/66*     (2006.01)
*H03F 3/00*     (2006.01)
*H03F 3/21*     (2006.01)
*H03F 3/24*     (2006.01)
*H03F 3/189*    (2006.01)
*H03M 1/80*     (2006.01)

(52) U.S. Cl.
CPC .............. *H03G 1/04* (2013.01); *H03M 1/804* (2013.01); *H03F 3/2175* (2013.01); *H03M 1/662* (2013.01); *H03F 3/005* (2013.01); *H03F 3/211* (2013.01); *H03F 3/245* (2013.01); *H03F 3/189* (2013.01); *H03F 3/68* (2013.01)
USPC ....................................... 330/124 R; 330/295

(58) Field of Classification Search
USPC .......................... 330/124 R, 295, 53, 84, 286
See application file for complete search history.

(56) References Cited

U.S. PATENT DOCUMENTS

| 6,703,956 | B1 | 3/2004 | Mueller et al. |
| 7,834,686 | B2 * | 11/2010 | Staszewski et al. ............. 330/51 |
| 8,164,499 | B1 | 4/2012 | Booth et al. |
| 8,344,799 | B2 * | 1/2013 | Hayakawa ................ 330/124 R |
| 2008/0303700 | A1 | 12/2008 | Tsuchi |
| 2013/0064271 | A1 | 3/2013 | Van De Beek et al. |

FOREIGN PATENT DOCUMENTS

JP          2003 143008 A       5/2003

OTHER PUBLICATIONS

Sang-Min Yoo et al., "A Switched-Capacitor RF Power Amplifier," IEEE JSSC, vol. 46, No. 12, Dec. 2011.
Extended European Search Report for counterpart application EP13194181.7 (Mar. 25, 2014).

* cited by examiner

*Primary Examiner* — Hieu Nguyen

(57) ABSTRACT

Signals are processed to facilitate the mitigation and/or cancellation of undesirable components within the signal. As consistent with one or more embodiments, input/delay circuits offset the phase of an input signal, as presented to respective amplifiers. The phase offset is used, upon combination of the outputs of the respective amplifiers, to cancel undesirable components of the signal. Such an approach may, for example, involve phase offset in a digital domain, with correction upon combination of the signals as presented in an analog domain.

18 Claims, 9 Drawing Sheets

US 8,928,401 B2

AMPLIFIER WITH FILTERING

Aspects of various embodiments are directed to amplifier apparatuses, systems and methods.

Many amplifiers, such as polar switching power amplifiers (SPAs) which generate a modulated square wave, have a high power efficiency. As the harmonics of the carrier emitted from such an SPA can pose co-existence issues with receivers of other radios, analog filtering has been used to decrease undesirable/out-of-band emissions. However, this can be an expensive solution, and present integration difficulties. Linear power amplifiers (PAs), which generate a modulated sine wave, can produce fewer or no harmonics. However the power efficiency of linear PAs is worse than SPAs with respect to a switching PA topology.

Combining the high power efficiency of a switched PA together with the spectral purity of a linear PA can address co-existence issues while achieving desirable power efficiency. For example, weighted voltages of switched PAs can be combined. However, the emitted harmonics can pose co-existence issues with receivers of other radios.

These and other matters have presented challenges to amplifiers and their implementation for a variety of applications.

Various embodiments are directed to amplifiers and their implementation, and to addressing issues such as those discussed above with respect to co-existence with other receivers and power efficiency.

In accordance with one or more embodiments, a switched capacitor power amplifier (PA) includes a semi-digital filter that operates using a (modulated) sine wave carrier. Undesirable signal components such as out-of band spurs, spectral replicas, quantization noise and out-of-band modulation, are suppressed using a semi-digital filtering approach. An input signal is offset in phase and processed at respective amplifiers, then combined to achieve the out-of-band cancellation. Such approaches can be implemented to achieve a high power efficiency (e.g., such as in a polar SPA), combined with the spectral purity of a linear PA. Modulation and pre-equalization can be done in the digital domain, without necessarily using analog filtering. This facilitates integration with a matching network and on-chip auto-matching and therein further facilitates increased data rates without necessarily incurring power penalties.

According to another example embodiment, an apparatus includes an input circuit, an output circuit and a plurality of delay circuits. Each delay circuit processes a digital input signal to provide a processed signal in which undesirable components are offset in phase relative to the phase of undesirable components in the processed signals provided by each of the other delay circuits. The input circuit receives and couples the digital input signal to each of the delay circuits, and the output circuit provides the respective processed signals to respective ones of a plurality of amplifier circuits. Using this approach, attenuation (e.g., near-cancellation) of the undesirable components upon is effected via amplification and combination of the processed signals.

Another example embodiment is directed to an apparatus and method involving the cancellation of undesirable components from an input signal. The input signal is processed at an input circuit to provide respective processed signals in which undesirable components in each processed signal are offset in phase, relative to such undesirable components in other ones of the processed signals. Respective ones of the processed signals are coupled to an input terminal of one of a plurality of amplifiers respectively having output terminals connected to one of a plurality of capacitors, each capacitor being connected to an output of a different one of the amplifiers. The undesirable components of the input signal are attenuated (e.g., mostly attenuated) by combining the outputs of the amplifiers, as passed via the capacitors, onto a common output terminal.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
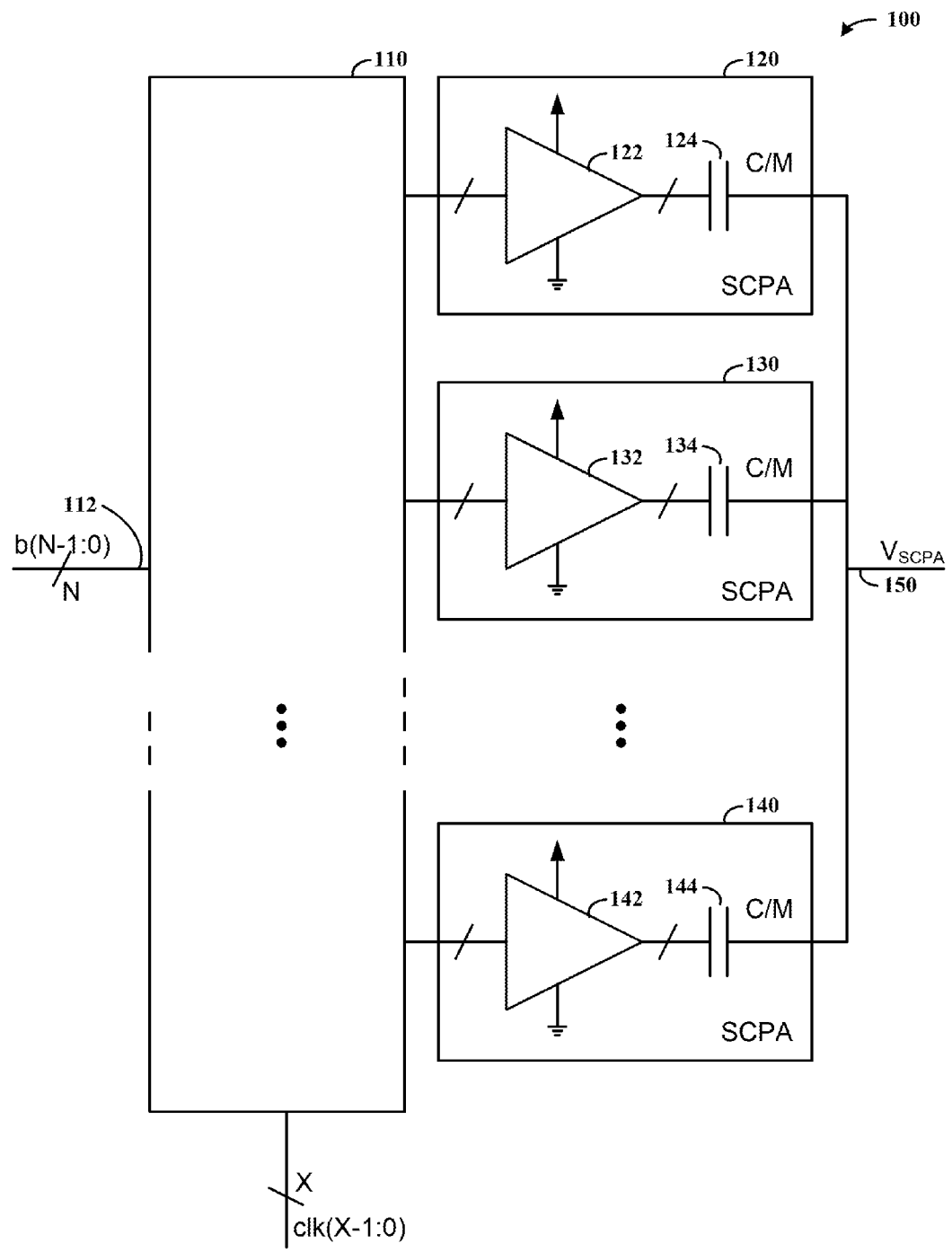
FIG. 1 shows a switched capacitor power amplifier (SCPA) apparatus with semi-digital filtering, in accordance with another example embodiment.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving filtering. While not necessarily so limited, various aspects may be appreciated through a discussion of examples using this context.

Various example embodiments are directed to a filtering approach in which undesirable signal components are mitigated or attenuated. Such an apparatus includes an input circuit that processes incoming signals by providing signals that are shifted in phase to respective amplifiers (e.g., switched capacitor power amplifiers). Upon combination of the outputs, undesirable components in the phase-shifted signals are attenuated. In some instances, modulation/up-conversion (e.g., oversampling and interpolating) is carried out on the input circuit, which facilitates the later attenuation of the undesirable components. The phase shift is set relative to the number of amplifiers and respective phases of the other signals (e.g., 180° phase shift relative to another signal), and provided to amplifiers in parallel, with the delayed signals on the inputs and the outputs thus connected together. Components that may be filtered in this way may include, for example, out-of-band components and others such as described above.

The phase shift is carried out using one or more of a variety of approaches. In some embodiments, the phase of the undesirable components in the input signal is offset in each processed signal by respectively shifting successive ones of the processed signals with a constant time shift, relative to the previous processed signal (e.g., the successive signals being presented to different amplifiers). This renders the phase shift proportional to frequency, thereby attenuating harmonics in the input signal upon combination of the outputs of the amplifiers at the output circuit. Accordingly, harmonics can be attenuated using a time domain representation and phasor representation of the time-shifted signals.

In a more particular embodiment, a modulated sine wave carrier signal is generated and presented to respective input ports of different amplifiers at an offset that sets the respective phases of the processed signals, to facilitate cancellation of the undesirable signal components upon combination of the outputs of the respective amplifiers. Such amplifiers and the respective delay circuit therefor (e.g., a phase-locked loop or a delay-locked loop) may, for example, be connected in parallel such that their outputs (e.g., as passed via a capacitor) are combined.

Various approaches as described herein, including those described in connection with an apparatus, may be implemented as a method-based approach. Further, various embodiments are directed to carrying out a limited portion of the methods as described, and to an apparatus or circuit that includes fewer than all components as shown in the figures or otherwise described. For instance, various embodiments are directed to an input circuit alone that functions to provide respective signals than can be used by amplifier circuits as described herein. In one such embodiment, an input circuit includes a plurality of delay circuits that process a digital input signal to provide a processed signal having undesirable components having a phase that is offset relative to the phase of undesirable components in the processed signals provided by each of the other delay circuits. Other embodiments are directed to such an input circuit, together with respective amplifiers connected to receive one of the processed signals (e.g., one amplifier per processed signal).

Turning now to the figures, FIG. 1 shows a switched capacitor power amplifier (SCPA) apparatus 100 with semi-digital filtering, in accordance with another example embodiment. The apparatus 100 includes an input circuit 110 (e.g., an interpolating and delaying circuit) and a plurality of amplifier sections 120, 130 and 140, with additional such sections being implemented to suit particular embodiments (represented via ellipses). The respective amplifier sections include amplifiers 122, 132 and 142 respectively coupled to capacitors 124, 134 and 144, with the output of the amplifiers being passed via the capacitors to an output circuit 150.

The input circuit 110 filters out-of-band emissions in sine waves applied at an input 112, using a semi-digital filtering approach such as described herein. In various contexts, such an approach can be implemented to address co-existence issues without necessarily using analog filtering, facilitating a smaller area and mitigating needs for external components, while achieving desirable power efficiency via the switched power amplifier. Using this approach, modulation and pre-equalization can be carried out in the digital domain. Accordingly, the input circuit 110 semi-digitally filters out-of-band signals (e.g., quantization noise/spectral replicas). These signals are attenuated by adding an opposite (180° phase shift) signal to the out-of-band signal, which is effected by combining SCPAs with different phases (e.g., the amplifier sections 120, 130 . . . 140 are provided with processed input signals such that their respective outputs are shifted in phase). In some embodiments, further replicas are attenuated out by interpolating at the input to the respective amplifiers, which increases the effective sample frequency. In some instances, such an approach is implemented to suppress (notch) the emission in a certain configurable band.

Figure 2:
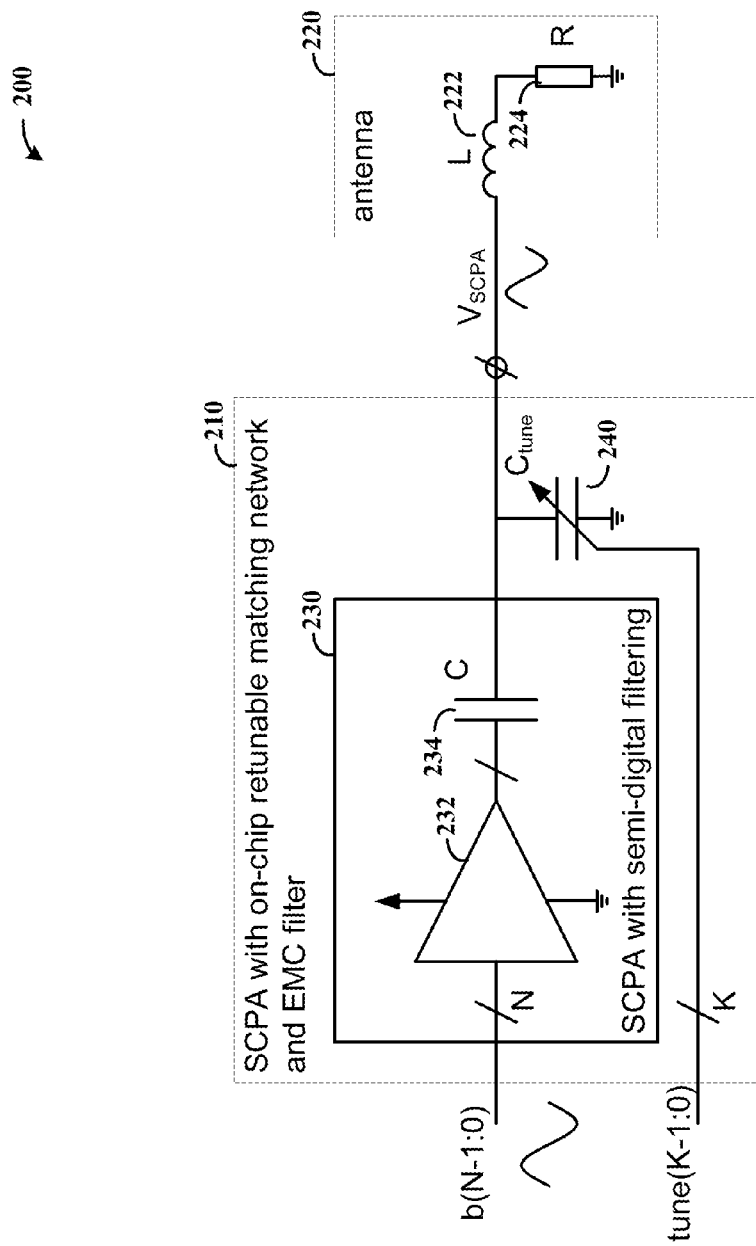
FIG. 2 shows an SCPA type apparatus integrated on-chip, in accordance with another example embodiment.

FIG. 2 shows an SCPA type apparatus 200, integrated on-chip in accordance with another example embodiment. The apparatus 200 includes an amplifier component 210 and an antenna circuit 220. The amplifier component 210 includes an SCPA 230 and a tunable capacitor circuit 240, with the SCPA 230 including a plurality of amplifiers (represented by 232) and capacitors (represented by 234) that are connected to an output of the amplifiers. The antenna circuit 220 includes an inductor circuit 222 and a resistor 224. The approach shown in FIG. 2 may, for example, be implemented for integrating the apparatus 100 shown in FIG. 1. By integrating the matching network on-chip, auto-matching becomes possible and can be used to facilitate an increase in data-rates without power penalties. For general information regarding integration, and for specific information regarding integrate that may be implemented in accordance with one or more example embodiments, reference may be made to U.S. patent application Ser. No. 13/229,070, which is fully incorporated herein by reference.

As discussed above, various embodiments are directed to amplifiers and related approaches in which a modified sine wave is used as an input signal in an SCPA, to mitigate issues with square-wave signal forms. For example, such square wave forms exhibit normalized voltages of the harmonics of the square wave, with respect to the carrier (first harmonic), in a switching power amplifier (SPA) with carrier frequency fc is equal to:

$$|V_{SPA}(f)| = \frac{fc}{f} \wedge f = fc, 3 \cdot fc, 5 \cdot fc, 7 \cdot fc \ldots \quad (1)$$

Accordingly, a modulated sine wave is used in which spectral replicas and quantization noise is attenuated. The following characterizes, via equations, aspects of an SCPA and related filtering as may be implemented in connection with one or more example embodiments. For instance, the spectral replicas of a piecewise constant shaped (zero order hold function) output with carrier frequency "fc" and sample frequency "fs" can be filtered as represented as follows:

$$|H_{SCPA}(f)| = \left| \frac{\sin[\pi \cdot f / fs]}{\pi \cdot f / fs} \right| \quad (2)$$

The normalized voltages of the spectral replicas of an example sine wave of an SCPA having carrier frequency "fc" and sample frequency "fs" are:

$$|V_{SCPAreplicas}(k*fs \pm fc)| = \left| \frac{\sin[\pi \cdot (k \cdot fs \pm fc)/fs]}{\pi \cdot (k \cdot fs - fc)/fs} \right| \approx \frac{fc/fs}{(k \cdot fs \pm fc)/fs} = \quad (3)$$

$$\frac{fc}{k \cdot fs \pm fc} = \frac{fc}{f} \wedge k = 1, 2, 3 \ldots$$

Accordingly, the normalized voltages of the spectral replicas are approximately equal to the normalized harmonics of the square wave:

$$|V_{SCPAreplicas}(k*fs \pm fc)| \approx \frac{fc}{k \cdot fs \pm fc} = \frac{fc}{f} = |V_{SPA}(f)| \wedge k = 1, 2, 3 \ldots \quad (4)$$

In addition, quantization noise and out-of-band modulated signals are filtered with the sinx/x function. The normalized voltage of the spectral quantization noise, of the sampled sine wave of the SCPA with carrier frequency "fc" and sample frequency "fs", is approximately:

$$|V_{SCPAq}(f = k \cdot fc)| \approx \left| \frac{\sin[\pi \cdot f/fs]}{\pi \cdot f/fs} \right| \cdot \sqrt{\frac{2 \cdot fc}{fs}} \cdot 2^{-N} \wedge k = 1, \quad (5)$$
$$3, 5, \ldots \wedge N = \# \text{ bits} \wedge fs/fc = 5, 6, 7$$

The first harmonic of the square wave is $\pi/4$ larger for the same matched load (Rmatch), such that for the same power at the antenna the matching resistance Rmatch should be $(4/\pi)^2$ smaller using a SCPA instead of an SPA.

The normalized out-of-band emission at a corresponding antenna is lower due to an extra filtering operated on the current by the antenna itself, as represented by:

$$|H_{emission}(f)| = |H_{SCPA/SPA}(f)| * \frac{1}{\sqrt{1 + \frac{1}{R^2}\left(2\pi \cdot f \cdot L - \frac{1}{2\pi \cdot f \cdot C}\right)^2}} \quad (6)$$

$$\approx |H_{SCPA/SPA}(f)| * \frac{1}{Q} \cdot \frac{fc}{f} \wedge$$

$$Q = \frac{2\pi \cdot fc \cdot L}{R}, f \gg fc = \frac{1}{2\pi\sqrt{LC}}$$

In accordance with various embodiments, the emission is further decreased by cancellation of the out-of-band emission to get low emission at the antenna (e.g., lower than using an SPA with filtering), and spurious emission can be attenuated in a certain band in which no emission is allowed.

Accordingly, various embodiments are directed to addressing out-of-band emission root causes in an SCPA, including spectral replicas on k*fs±fc, k=1, 2, 3, . . . , quantization noise and out of band emission caused by the modulation. In some embodiments, spectral replicas are shifted to higher frequencies and thus decreased by increasing the sample frequency. In addition, the quantization noise spectral density can be decreased by increasing the sample frequency and by increasing the number of bits. In addition, the quantization noise per Herz further can be decreased by choosing a sample frequency that is not an integer multiple of the carrier frequency "fc," decreasing the beat frequency. By choosing for example f's=(a*fs+fc)/fc, a=1, 2, 3, . . . , the quantization noise per Hz will decrease with 10*LOG 10(a), with equation 5 being rewritten as:

$$\left|V_{SCPAq}\left(f = \frac{k}{a} \cdot fc\right)\right| \approx \quad (7)$$

$$\left| \frac{\sin[\pi \cdot f/fs]}{\pi \cdot f/fs} \right| \cdot \sqrt{\frac{2 \cdot fc}{f} \cdot \frac{1}{a+1}} \cdot 2^{-N} \wedge N = \# \text{ bits}$$

Filtering, such as what is referred to as semi-digital filtering, of replicas is carried out in one or more of a variety of manners, depending upon the application. In some embodiments, spectral replicas of a carrier appearing on k*fs±fc, k=1, 2, 3, . . . are filtered. Two SCPAs are connected in parallel with their outputs connected together, and a delayed version ($\Delta T$) of an input signal is applied thereto, producing notches at $f_{notch}(n)=2(n+1)/\Delta T$, n=0, 2, 4, 6 . . . . For instance, if fs−fc has to be removed, a delay is chosen to be equal to 1/(2*fs), which can be generated with an inverse clock, to generate notches on $f_{notch}(k)$=k/fs, k=1, 3, 5, 7 . . . . In some instances in which the phase shift is not exactly 180° at the replica frequency, the replicas are not attenuated completely; accordingly, all the pairs of replicas at k*fs±fc, k=1, 3, 5, 7, . . . are attenuated as follows.

$$H_{notch1}(z) = \left(1 + z^{-\frac{1}{2}}\right)/2 \Rightarrow |H_{notch1}(f)| = \left|\cos\left[\frac{\pi}{2} \cdot \frac{f}{fs}\right]\right| \quad (8)$$

In general:

$$H_{notch}(z, n) = \left(1 + z^{-\frac{1}{2n}}\right)/2 \Rightarrow |H_{notch}(f, n)| \quad (9)$$
$$= \left|\cos\left[\frac{\pi}{2} \cdot \frac{f}{n \cdot fs}\right]\right| \wedge n = 1, 2, 3, 4, \ldots$$

So in general the replicas at n*k*fs±fc^n, k=1, 3, 5, . . . are attenuated by:

$$|H_{notch,replicas}(n \cdot k \cdot fs \pm fc, n)| = \left|\cos\left[\frac{\pi}{2} \cdot \frac{k \cdot fs \pm fc}{n \cdot fs}\right]\right| \approx \frac{fc}{n \cdot fs} \quad (10)$$
$$\text{if } fs \gg fc \wedge k = 1, 3, 5 \ldots \wedge n = 1, 2, 3, \ldots$$

In some implementations, notch transfer functions are multiplied as follows:

$$H_{notch1}(z) = \left(1 + z^{-\frac{1}{2}}\right)/2 \quad (11)$$
$$H_{notch2}(z) = \left(1 + z^{-\frac{1}{4}}\right)/2$$
$$H_{MAF4}(z) = H_{notch1} \cdot H_{notch1} = \left(1 + z^{-\frac{1}{4}} + z^{-\frac{1}{2}} + z^{-\frac{3}{4}}\right)/4$$
$$\Rightarrow |H_{MAF4}(f)| = \left|\frac{\sin\left(\pi \cdot \frac{f}{fs}\right)}{4\sin\left(\pi \cdot \frac{f}{4fs}\right)}\right|$$

Figure 3:
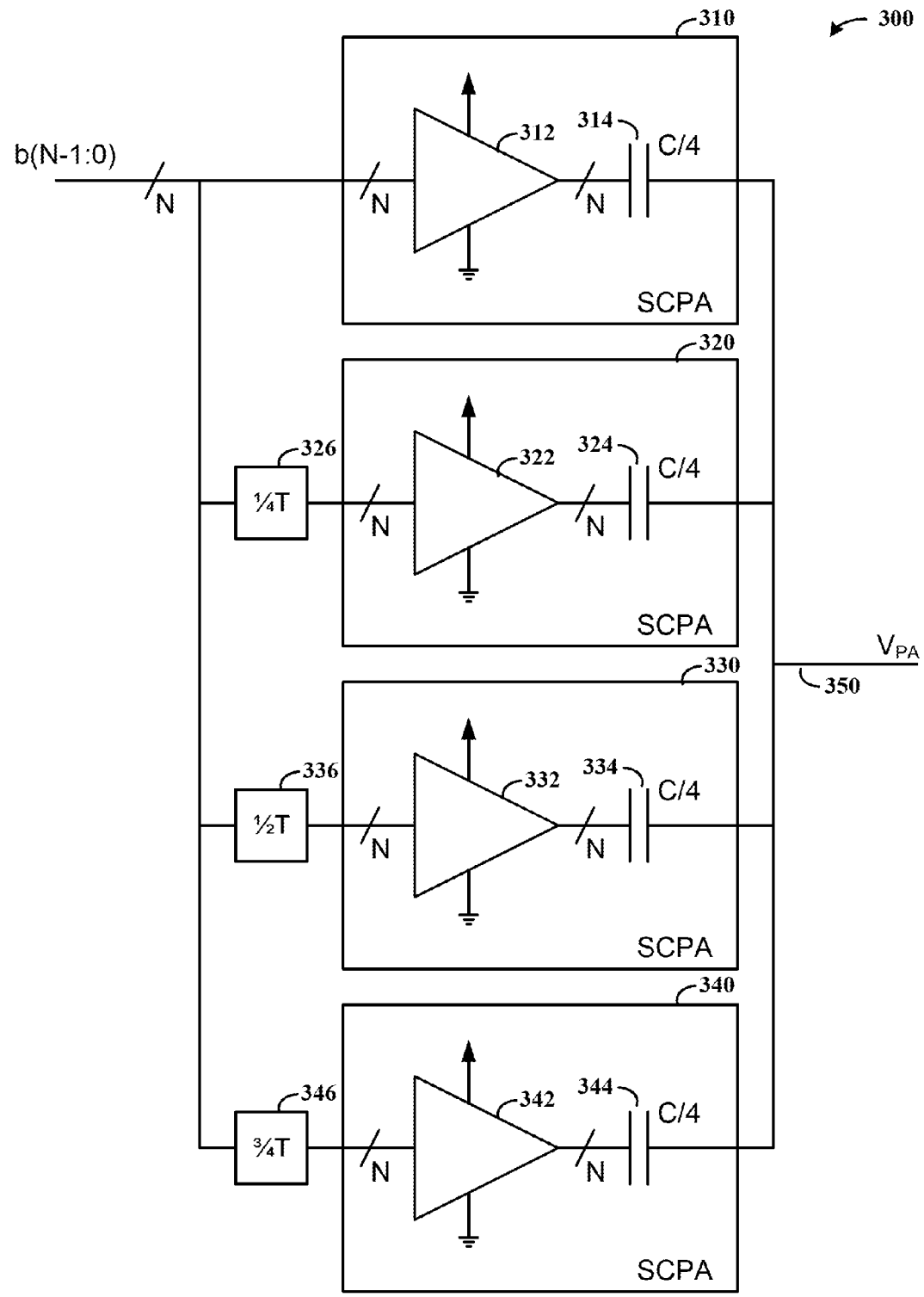
FIG. 3 shows another SCPA apparatus, in accordance with another example embodiment.

Referring now to FIG. 3, an implementation of this filter function is depicted therein, in which four SCPAs are used as well as a 4-phase clock to generate delays. Specifically, FIG. 3 shows an apparatus 300 having four SCPAs 310, 320, 330 and 340, each having amplifier circuits 312, 322, 332, and 342 (each including a plurality of amplifiers) and capacitor circuits 314, 324, 334, and 344 (each including a plurality of capacitors) connected to an output of the amplifier. Each amplifier circuit 312, 322, 332 and 342 includes a plurality of amplifiers, and each capacitor circuit 314, 324, 334 and 344 includes a plurality of capacitors, with each amplifier being connected to one of the capacitors. The input to SCPAs 320, 330 and 340 are respectively delayed by ¼T (326), ½T (336), and ¾T (346), and the outputs of all SCPAs are connected at output circuit 350. In some embodiments, this filter function is carried out using an M phase clock and implemented as follows:

$$|H_{MAFM}(f)| = \left|\frac{\sin\left(\pi \cdot \frac{f}{fs}\right)}{M\sin\left(\pi \cdot \frac{f}{M \cdot fs}\right)}\right| \quad (12)$$

For M=2, 4, 8, . . . the notches are on a multiple of fs, and replicas that are not filtered are around n*M*fs with n=1, 2, 3, . . . . So where M=4, the first replica that is not filtered is at 4fs−fc. Accordingly, this approach filters replicas as well as quantization noise and out-of-band signals caused by modulation.

As discussed above, interpolation is carried out at an input circuit, in accordance with one or more embodiments. For instance, by using multiple SCPAs in parallel with the different delays at the input, the input signals can be interpolated to find the correct input value for the given delay. By interpolating it is possible to remove spectral replicas, since the effective sample frequency increases. In some implementations, a moving average filter is used to interpolate the signals, as implemented as follows with a sinx/x function via the interpolation:

$$|H_{interpolate}(f)| = \quad (13)$$

$$\left|\frac{\sin\left(\pi \cdot \frac{f}{fs}\right)}{M\sin\left(\pi \cdot \frac{f}{M \cdot fs}\right)}\right| \cdot \left|\frac{\sin[\pi \cdot f/(M \cdot fs)]}{\pi \cdot f/(M \cdot fs)}\right| = \left|\frac{\sin[\pi \cdot f/fs]}{\pi \cdot f/fs}\right|$$

Accordingly, the sin x/x filtering belonging to fs remains the same, but effectively removes the replicas up to M*fs for fs>>fc, and decreased quantization noise with 10LOG10(M).

Figure 4:
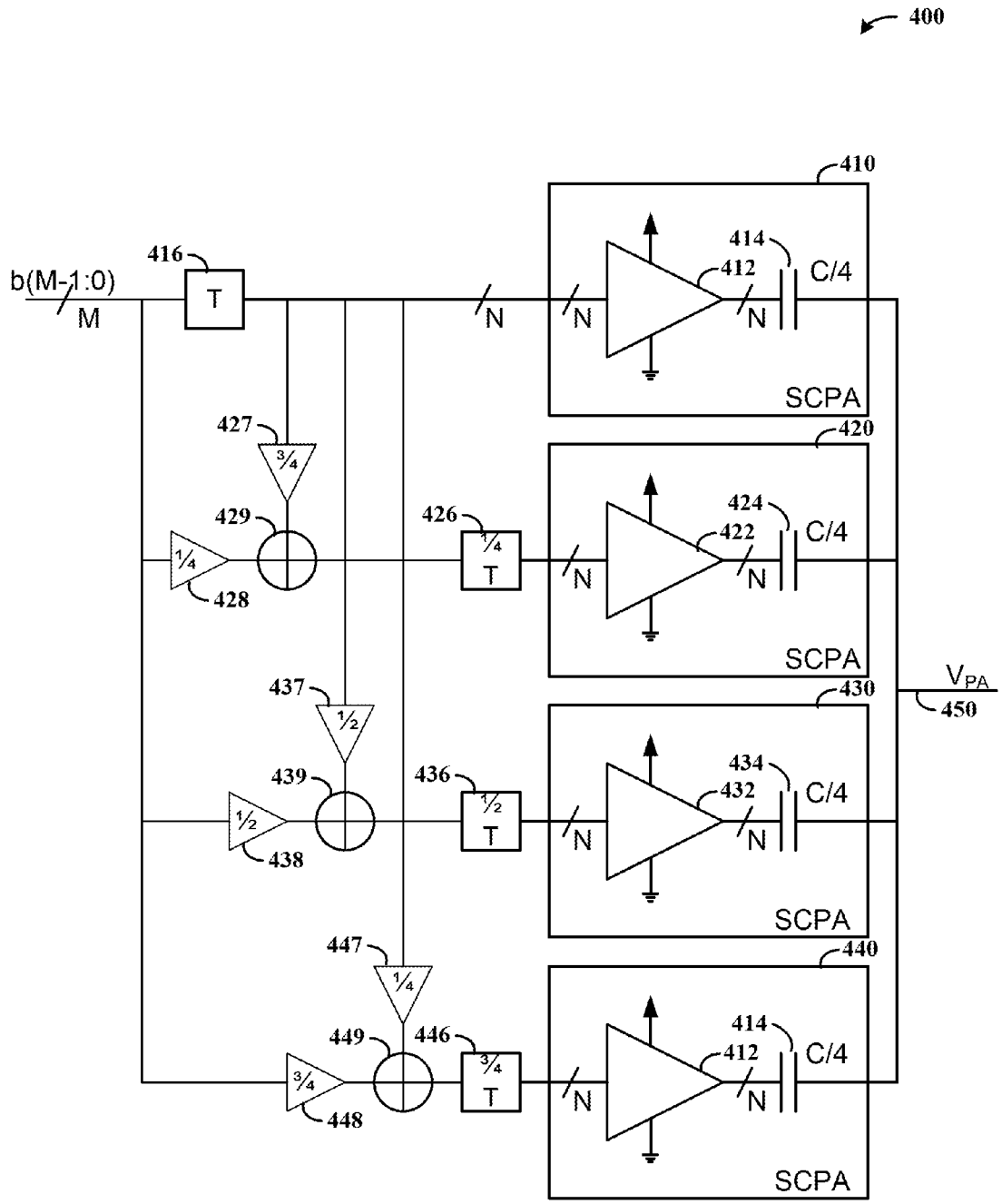
FIG. 4 shows an apparatus for interpolation, in connection with another example embodiment.

FIG. 4 shows an apparatus 400 configured and arranged for interpolation as discussed above, in connection with another embodiment. The apparatus 400 includes respective SCPAs 410, 420, 430 and 440, each having amplifier circuits 412, 422, 432 and 442 as well as capacitor circuits 414, 424, 434 and 444, with the respective outputs connected to an output circuit 450. As consistent with the above, each amplifier circuit includes a plurality of amplifiers, and each capacitor circuit includes a plurality of capacitors. An input circuit includes timing (delay) circuits 416, 426, 436 and 446 respectively coupled to the SCPAs 410, 420, 430 and 440. The respective timing circuits 426, 436 and 446 are fed by amplifier/adder circuits as shown (427-429, 437-439 and 447-449).

Where sampling is carried out just before and after a top of a sine wave with a highest frequency, and if the interpolation error is smaller than the quantization error, the replicas are completely removed:

$$1 - \sin\left(\frac{\pi}{2} \cdot \left[1 - \frac{f_{max}}{2 \cdot f_s}\right]\right) < 2^{-(n+1)} \text{ gives:} \quad (14)$$

$$n <^2 \log\left(\frac{1}{1 - \sin\left(\frac{\pi}{2} \cdot \left[1 - \frac{f_{max}}{2 \cdot f_s}\right]\right)}\right) - 1$$

$$\text{or } f_{max} < 2 \cdot f_s \cdot \left(1 - \frac{2}{\pi} \cdot \arctan(1 - 2^{-(N+1)})\right)$$

Where fmax=1.5*fc, the replicas are removed for n<11 bit if fc=56fs, and the replicas are removed for fs>18fc (fmax<fs/12.5) if n=8. If the linear interpolation error is smaller than the quantization error caused by the digital to analog conversion of the PA, a first-order interpolation is used to achieve sufficient accuracy (e.g., as shown in equation 16 below).

In some implementations, semi-digital filtering as discussed herein is carried out around the carrier frequency. By making a delayed version ΔT of the output of the SCPA adding the two outputs together a notches will appear at a $f_{notch}(n)=2(n+1)/\Delta T$, n=0, 2, 4, 6 . . . . Accordingly, selected harmonics can be removed. For instance, if the $7^{th}$ harmonic (7*fc) is to be removed, the delay is set to ΔT=1/(2*7*fc) and $f_{notch}$=7fc, 21fc, 38fc, 52fc . . . . If fs/(2 $f_{notch}$(0))=C and C=1, 2, 3, . . . then the delay is C clock cycles (ΔT=C/fs):

$$H_{notch1}(z) = (1 + z^{-C})/2 \Rightarrow |H_{notch1}(f)| = \left|\cos\left[\frac{\pi}{2} \cdot \frac{2 \cdot C \cdot f}{fs}\right]\right| \quad (15)$$

Giving a notch on $f_{notch}(n)=(n+1)*fs/(2*C)$, n=0, 1, 2, 3 . . . , notch transfer functions are multiplied in accordance with one or more embodiments, as follows:

$$H_{notch1}(z) = (1 + z^{-1})/2 \quad (16)$$

$$H_{notch2}(z) = (1 + z^{-2})/2$$

$$H_{notch3}(z) = (1 + z^{-4})/2$$

$$H_{MAF8}(z) = H_{notch1} \cdot H_{notch2} \cdot H_{notch3} =$$

$$\frac{(1 + z^{-1} + z^{-2} + z^{-3} + z^{-4} + z^{-5} + z^{-6} + z^{-7})}{8}$$

$$\Rightarrow |H_{MAF8}(f)| = \left|\frac{\sin\left(\pi \cdot \frac{8 \cdot f}{fs}\right)}{8\sin\left(\pi \cdot \frac{f}{fs}\right)}\right|$$

This approach can be implemented as a moving average filter made with L samples as follows, in which notches appear at multiples of fs/L:

$$|H_{MAFL}(f)| = \left|\frac{\sin\left(\pi \cdot \frac{L \cdot f}{fs}\right)}{L \cdot \sin\left(\pi \cdot \frac{f}{fs}\right)}\right| \quad (17)$$

In some embodiments, semi-digital interpolation is combined with semi-digital filtering around the carrier frequency, to filter out-of-band spurs:

$$|H(f)| \approx \left|\frac{\sin\left(\pi \cdot \frac{L \cdot f}{fs}\right)}{L \cdot \sin\left(\pi \cdot \frac{f}{fs}\right)}\right| \cdot \left|\frac{\sin[\pi \cdot f/fs]}{\pi \cdot f/fs}\right| \wedge fs = 56fc, L = 8 \quad (18)$$

The quantization noise is approximately:

$$|V_{SCPAq}(f = k \cdot fc)| \approx \quad (19)$$

$$\left|\frac{\sin\left(\pi \cdot \frac{L \cdot f}{fs}\right)}{L \cdot \sin\left(\pi \cdot \frac{f}{fs}\right)}\right| \cdot \left|\frac{\sin[\pi \cdot f/fs]}{\pi \cdot f/fs}\right| \cdot \sqrt{\frac{2 \cdot fc}{M \cdot fs}} \cdot 2^{-N} \wedge fs =$$

$$56fc, L = 8, M = 4, N = 6 \text{ bits}$$

Since M=4, the first replica is at M*fs−fc=4fs−fc and the normalized voltage of the remaining spectral replicas are:

$$|V_{SCPAreplicas}(M*k*fs \pm fc)| = \qquad (20)$$

$$\left|\frac{\sin[\pi \cdot (M \cdot k \cdot fs \pm fc)/fs]}{\pi \cdot (M*k \cdot fs \pm fc)/fs}\right| \approx \frac{fc/fs}{(M*k \cdot fs \pm fc)/fs} =$$

$$\frac{fc}{M*k \cdot fs} \wedge k = 1, 2, 3, \ldots, M = 4$$

In some implementations in which out-of-band noise is drastically decreased yet a replica appears at M*fs, the radiated field at high frequencies (e.g., 223*fc) can be held low due to low-pass filtering effects such as parasitic capacitances, which shorten the antenna and due to the skin effect. In some embodiments, such replicas are further mitigated, such as by increasing M and/or fs further, or using analog filtering.

Figure 5:
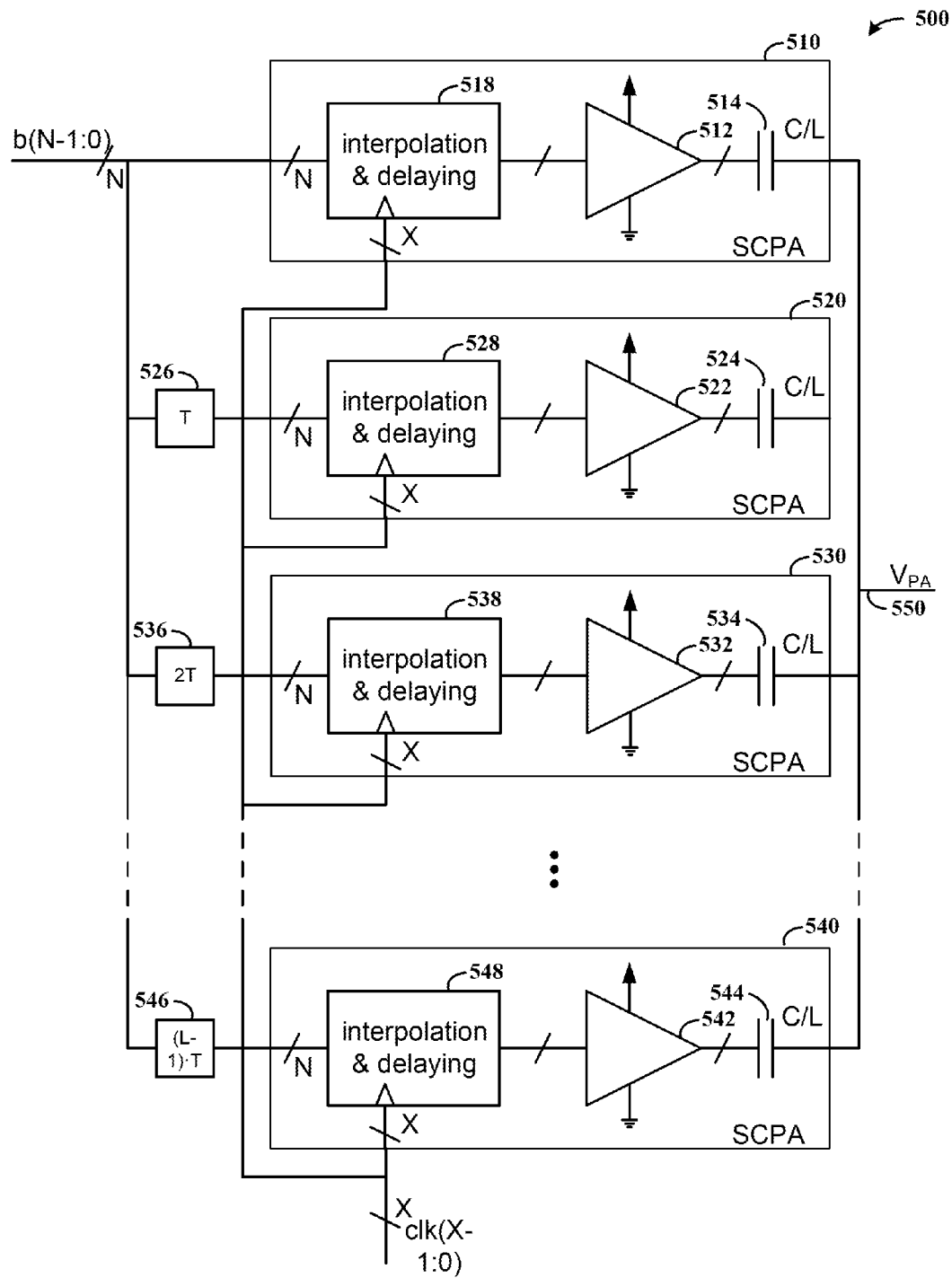
FIG. 5 shows an apparatus including a switched capacitor power amplifier circuit with semi-digital filtering, in accordance with another example embodiment.

Referring now to FIG. 5, an apparatus 500 includes a switched capacitor power amplifier circuit with semi-digital filtering, in accordance with another example embodiment. The apparatus 500 includes SCPAs 510, 520, 530 and 540, respectively having amplifier circuits (512, 522, 532, 542) with capacitor circuits (514, 524, 534, 544) at the output thereof, and interpolation & delaying circuits (518, 528, 538, 548) feeding the amplifiers. As consistent with the above, each amplifier circuit includes a plurality of amplifiers, and each capacitor circuit includes a plurality of capacitors, each amplifier being connected to one of the capacitors (e.g., on a one-to-one ratio). Timing delay circuits 526, 536 and 546 respectively delay inputs (T, 2T and (L−1)T) to the SCPAs 520, 530 and 540.

The various embodiments described herein may be implemented in a variety of manners. For instance, carrier waves other than sine waves, such as a square wave, are used. Delays can be made in different ways, such as by using a Phase Locked Loop (PLL) or a Delay Locked Loop (DLL). In addition, different delays can be made to cancel out-of-band components (e.g., the delays in FIG. 5 can be different than T, 2T, . . . , (L−1)T with T=1/fs), depending on the filter function. Further, different amplification factors are implemented for the taps in the filter functions, and can be set based upon the filter function. Dithering is added in some embodiments, such as where the quantization noise is not white enough. For differential applications, an extra notch at fnotch can be generated by generating the differential signal and delaying the signal with 1/(2*fnotch) (e.g., and with the common mode signal spread out by randomly delaying the positive as the negative output with 1/(2*fnotch).

Figure 6:
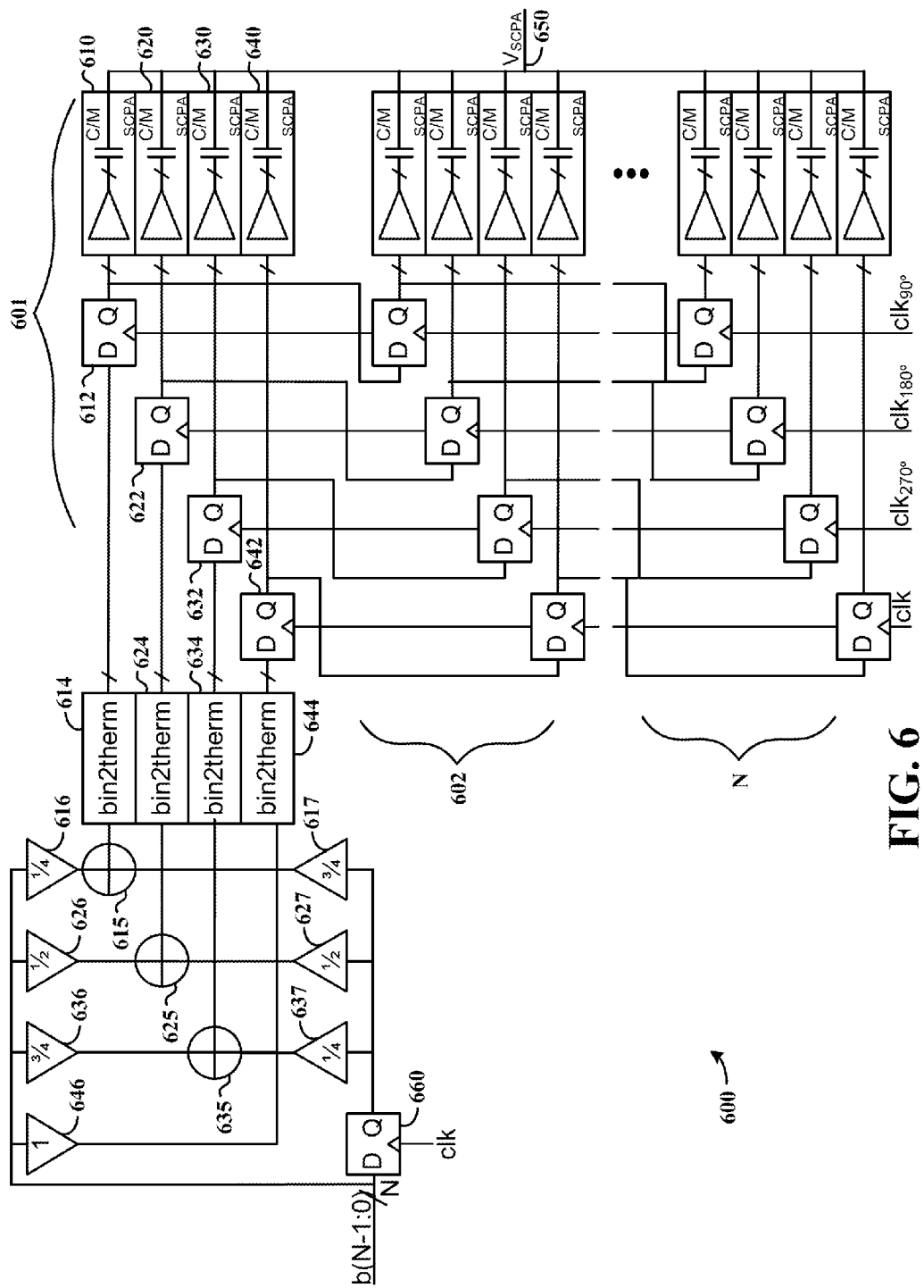
FIG. 6 shows an amplifier apparatus including an input delay-type circuit operative with thermometer-coded power amplifiers, in accordance with another example embodiment.

Turning now to FIG. 6, an example embodiment involves an amplifier apparatus 600 having an input delay-type circuit operative with thermometer-coded power amplifiers to decrease the power needed to charge and discharge capacitors, together with finite impulse response (FIR) filtering. The apparatus 600 includes respective amplifier banks, with three such banks shown, and with various embodiments amenable to implementation with multiple such banks. The amplifier bank 601 includes switched-capacitor amplifier components 610, 620, 630 and 640 respectively coupled to flip-flops 612, 622, 632 and 642, with amplifier banks 602-N including similar components, and the amplifier banks being coupled to an output circuit 650. Each flip-flop is connected to one of respective binary-to-thermometer coders 614, 624, 634 and 644, with the first three being coupled to adders 615, 625 and 635 which are respectively coupled to amplifiers 616/617, 626/627, 636/637. Binary-to-thermometer coder 644 is coupled to amplifier 646 (with no adder). Input flip-flop 660 is connected to inputs to the respective amplifiers.

Figure 7:
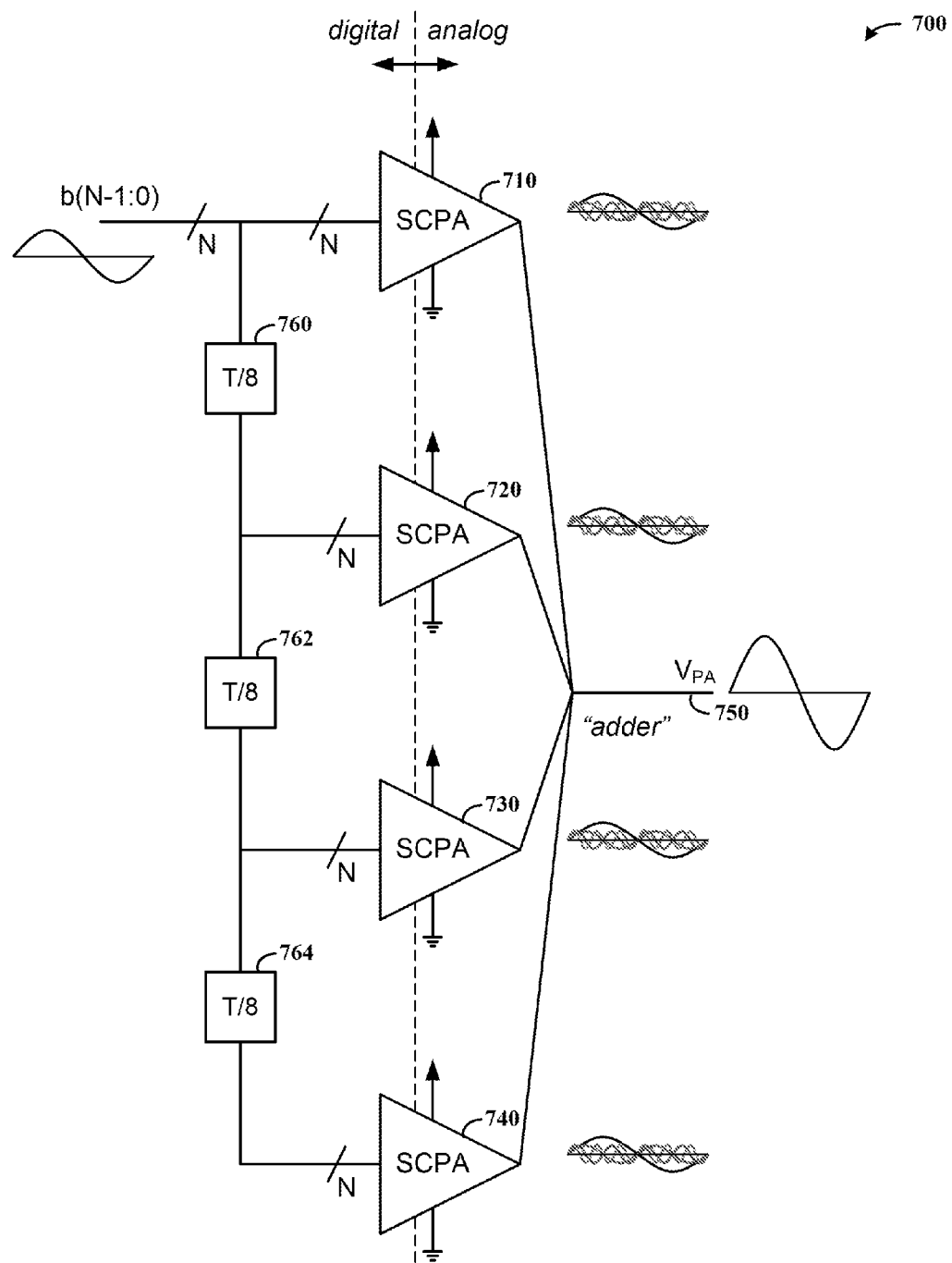
FIG. 7 shows an apparatus for semi-digital filtering, in accordance with another example embodiment.

Undesirable signals, such as out-of-band signals, quantization noise and replicas are attenuated using one or more of a variety of approaches. In some embodiments, spectral impurities such as spectral replicas, quantization noise and others that are difficult to filter (or cannot be filtered) in the digital domain are attenuated by adding opposite (180° phase shift) signals, in connection with the approach shown in FIG. 7. Specifically, FIG. 7 shows an example embodiment involving an apparatus 700 configured and arranged for semi-digital filtering in which the output is filtered with:

$$|H(f)| = \left|\frac{\sin\left(\frac{\pi}{2} \cdot \frac{f}{fc}\right)}{4 \cdot \sin\left(\frac{\pi}{2} \cdot \frac{f}{4 \cdot fc}\right)}\right| \qquad (21)$$

The apparatus 700 includes SCPAs 710, 720, 730 and 740, fed by respective T/8 delay circuits 760, 762 and 764 as shown (with SCPAs 720, 730 and 740 being respectively fed T/8, T/4 and 3T/8 delayed signals). Using this approach (and by way of example), the $2^{nd}$, $4^{th}$ and $6^{th}$ harmonic of the signal with frequency fc=1/T are attenuated completely in an output signal combined at output circuit 750. Other harmonics can be attenuated, if desired, using a similar approach.

Figure 8:
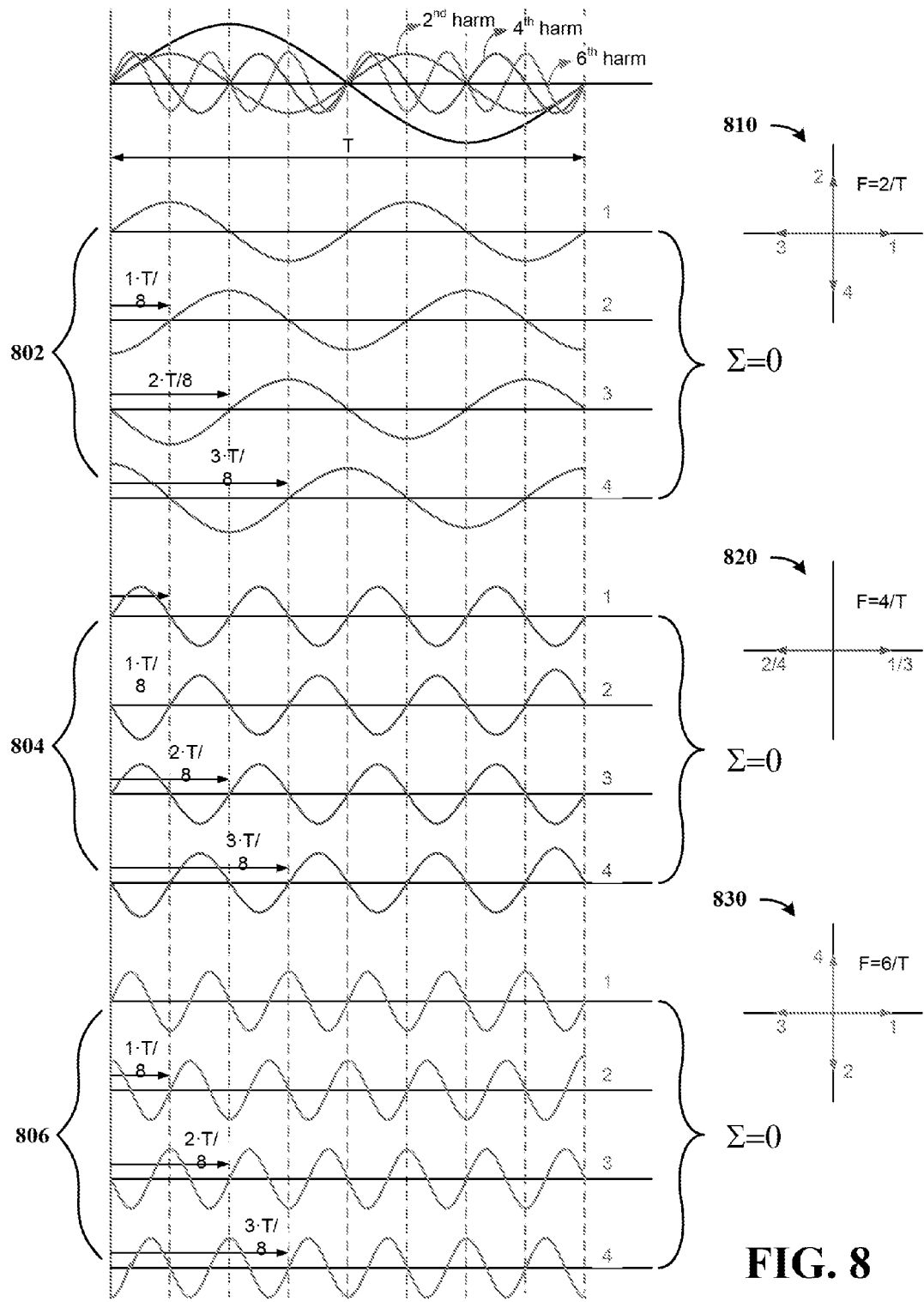
FIG. 8 shows an example cancellation of $2^{nd}$, $4^{th}$ and $6^{th}$ harmonics, in accordance with another example embodiment.

FIG. 8 shows an example embodiment involving cancellation of $2^{nd}$, $4^{th}$ and $6^{th}$ harmonics using time domain a constant time with the phase shift being proportional to frequency according to $\Delta\phi = 2\pi \cdot f \cdot \Delta t$. The signals shown at 802, 804 and 806 respectively correspond to the $2^{nd}$, $4^{th}$ and $6^{th}$ harmonics shown on the input signal at the top of the figure, as filtered via representation in plots 810, 820 and 830.

Figure 9:
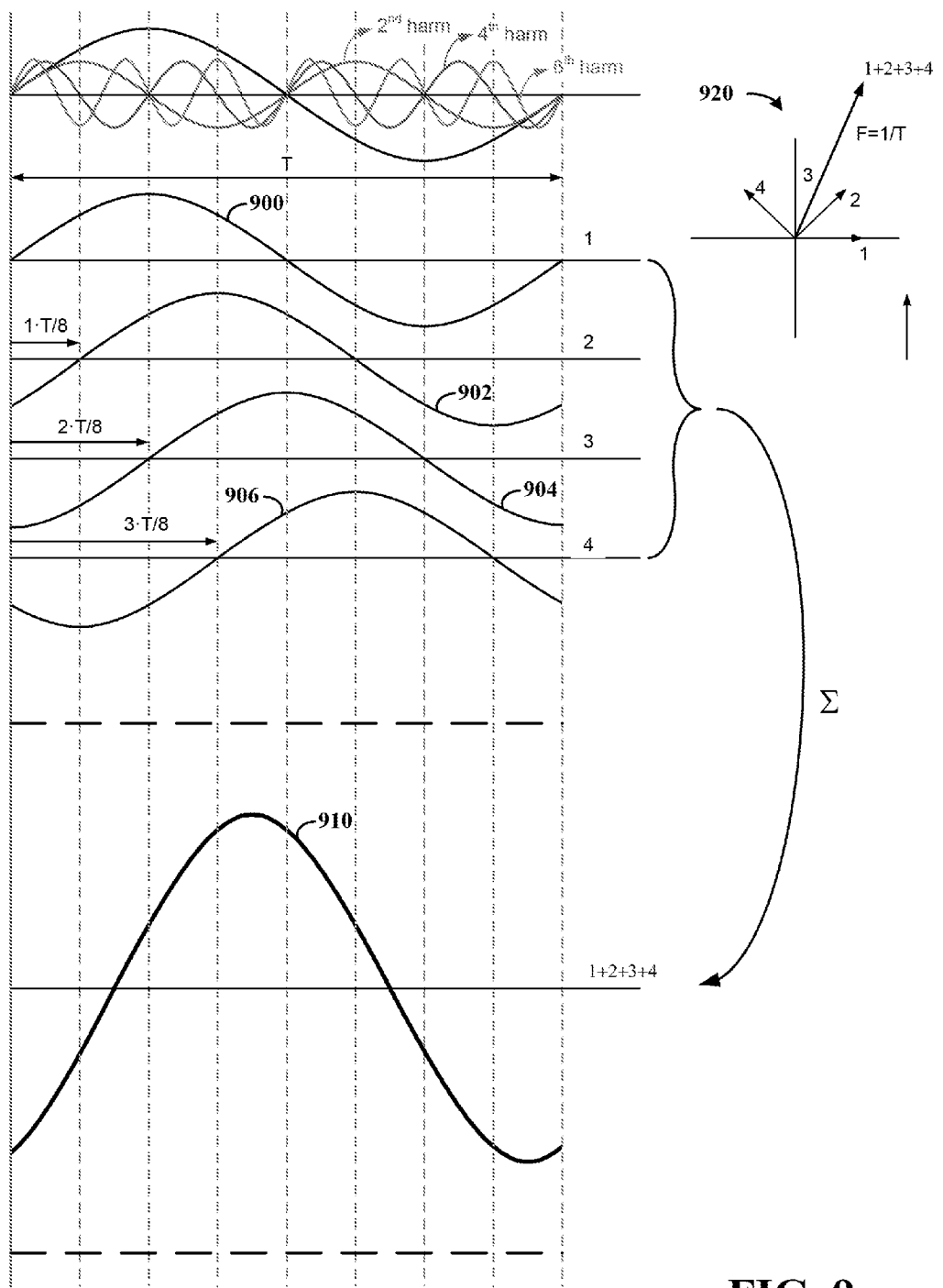
FIG. 9 shows a time domain and phasor representation of a desirable signal, in accordance with another example embodiment.

FIG. 9 shows the time domain and phasor representation of a desirable signal with frequency fc, consistent with one or more embodiments. Signals 900, 902, 904 and 906 result from the respective shifting of the input signal and, upon combination, provide an output signal 910 that is clean with respect to the undesirable components in the harmonics shown. Plot 920 shows vector representations of the respective signals. Such an approach may be implemented, for example, in connection with one or more embodiments herein, such as described in connection with the figures.

Based upon the above discussion and illustrations, those skilled in the art will readily recognize that various modifications and changes may be made to the various embodiments without strictly following the exemplary embodiments and applications illustrated and described herein. For example, circuitry effecting similar function may be implemented with and/or instead of the circuitry shown in the figures and described herein. As another example, signals may be attenuated by being nearly cancelled (e.g., where perfect cancelling may not be practical, leaving a few percent of residual components). In addition, certain circuitry as shown may be omitted in a similar context. With reference to filtering undesirable signal components, a variety of types of components can be filtered, such as out-of-band components and others, with the respective embodiments describing one type of such a component being amenable to filtering with other component types. In some embodiments, circuits shown herein are implemented with wireless communications, such as radio-frequency identification RFID communications (see, e.g., the NFC standard (ISO14443)), which can be used in smartphones and card readers. Such modifications do not depart from the true spirit and scope of various aspects of the disclosure, including aspects set forth in the claims.

What is claimed is:

1. An apparatus comprising:
a plurality of amplifiers, each amplifier having an input terminal and an output terminal;
a plurality of capacitors respectively coupled to different ones of the output terminals of the plurality of amplifiers;
an output circuit coupled to the capacitors and configured and arranged to combine the outputs of the amplifiers as passed via the capacitors onto a common output terminal; and
an input circuit configured and arranged to
process an input signal to provide respective processed signals in which undesirable components in each processed signal are offset in phase relative to undesirable components in other ones of the processed signals,
couple respective ones of the processed signals to different ones of the input terminals of the amplifiers, thereby cancelling the undesirable components of the input signal upon combination of the outputs of the amplifiers at the output circuit; and
wherein the input circuit is configured and arranged to offset the phase of the undesirable components by respectively shifting successive ones of the processed signals with a constant time shift relative to the previous processed signal, rendering the phase shift proportional to frequency, thereby cancelling harmonics in the input signal upon combination of the outputs of the amplifiers at the output circuit.

2. The apparatus of claim 1, wherein the input circuit is configured and arranged to offset the phases of the undesirable components by offsetting the phase of each processed signal to a phase that, when combined with the other processed signals, cancels the undesirable components.

3. The apparatus of claim 1, wherein the harmonics are cancelled by using a time domain representation and phasor representation of the time-shifted signals.

4. The apparatus of claim 1, wherein the input circuit is configured and arranged to offset the phase of the undesirable components by oversampling and interpolating the input signal to provide each of the processed signals, and offsetting the phase of the respective processed signals presented to respective ones of the amplifiers.

5. The apparatus of claim 1, wherein the input circuit is configured and arranged to process the input signal to provide the respective processed signals by generating a modulated sine wave carrier signal and presenting the modulated sine wave carrier signal to the respective input ports of each of the amplifiers at an offset that sets the respective phases of the processed signals to facilitate cancellation of the undesirable signal components upon combination of the outputs of the respective amplifiers.

6. The apparatus of claim 1, wherein the amplifiers are connected between the input circuit and the output circuit in parallel.

7. The apparatus of claim 1, wherein the input circuit includes delay circuit configured and arranged to offset the phase of the processed signals by delaying the signals as provided to respective ones of the amplifiers.

8. The apparatus of claim 7, wherein the delay circuit includes at least one of a phase-locked-loop and a delay-locked-loop.

9. A method comprising:
processing an input signal to provide respective processed signals in which undesirable components in each processed signal are offset in phase relative to undesirable components in other ones of the processed signals;
coupling respective ones of the processed signals to an input terminal of one of a plurality of amplifiers respectively having output terminals connected to one of a plurality of capacitors, each capacitor being connected to an output of a different one of the amplifiers;
cancelling the undesirable components of the input signal by combining the outputs of the amplifiers, as passed via the capacitors, onto a common output terminal; and
wherein processing the input signal includes respectively shifting successive ones of the processed signals with a constant time shift relative to the previous processed signal, rendering the phase shift proportional to frequency, thereby cancelling harmonics in the input signal upon combination of the outputs of the amplifiers at the output circuit.

10. The method of claim 9, wherein processing the input signal includes offsetting the phase of each processed signal to a phase that, when combined with the other processed signals, cancels the undesirable components.

11. The method of claim 9, wherein processing the input signal includes oversampling and interpolating the input signal to provide the processed signals, and offsetting the phase of each processed signal as presented to respective ones of the amplifiers.

12. The method of claim 9, wherein
processing the input signal includes generating a modulated sine wave carrier signal, and
coupling respective ones of the processed signals to the input terminal of one of the plurality of amplifiers includes presenting the modulated sine wave carrier signal to the respective input terminals of each of the amplifiers at an offset that sets the respective phases of the processed signals.

13. The method of claim 9, wherein coupling respective ones of the processed signals to the input terminal of one of the plurality of amplifiers includes coupling the processed signals to amplifiers connected between the input circuit and the output circuit in parallel, further including using the amplifiers to amplify the processed signals and providing the amplified processed signals to the capacitors.

14. The method of claim 9, wherein processing an input signal includes offsetting the phase of the processed signals by delaying the signals as provided to respective ones of the amplifiers.

15. An apparatus comprising:
a plurality of delay circuits, each delay circuit being configured and arranged to process a digital input signal to provide a processed signal having undesirable components having a phase that is offset relative to the phase of undesirable components in the processed signals provided by each of the other delay circuits;
an input circuit configured and arranged to receive the digital input signal and to couple the digital input signal to each of the delay circuits;
an output circuit configured and arranged to provide the respective processed signals to respective ones of a plurality of amplifier circuits, thereby facilitating cancellation of the undesirable components upon amplification and combination of the processed signals; and
wherein the input circuit and the delay circuits are configured and arranged to offset the phase of the undesirable components by respectively shifting successive ones of the processed signals with a constant time shift relative to the previous processed signal, rendering the phase shift proportional to frequency, thereby cancelling harmonics in the input signal upon combination of outputs from the amplifiers.

16. The apparatus of claim 15, further including the plurality of amplifier circuits, each amplifier circuit having an amplifier and a capacitor connected to the output of the amplifier, and a second output circuit connected to the capacitors and configured and arranged cancel the undesirable components by combining the signals presented at the capacitors.

17. The apparatus of claim 15, wherein the delay circuits are configured and arranged to provide the processed signal by sampling and interpolating the input signal, and offsetting the sampled and interpolated input signal in phase.

18. The apparatus of claim 15, wherein the delay circuits are configured and arranged to offset the phases of the undesirable components in each signal by offsetting the phase of each processed signal to a phase that, when combined with the other processed signals, cancels the undesirable components.

* * * * *